United States Patent [19]
Engh et al.

[11] Patent Number: 5,963,462
[45] Date of Patent: *Oct. 5, 1999

[54] INTEGRATED CIRCUIT SYSTEM FOR ANALOG SIGNAL STORING AND RECOVERY INCORPORATING READ WHILE WRITING VOLTAGE PROGRAM METHOD

[75] Inventors: Lawrence D. Engh, Redwood City; Trevor Blyth, Milpitas, both of Calif.

[73] Assignee: Information Storage Devices, Inc., San Jose, Calif.

[*] Notice: This patent is subject to a terminal disclaimer.

[21] Appl. No.: 09/067,642

[22] Filed: Apr. 27, 1998

Related U.S. Application Data

[62] Division of application No. 08/306,266, Sep. 14, 1994, Pat. No. 5,629,890.

[51] Int. Cl.⁶ ................................................ G11C 27/00
[52] U.S. Cl. ................ 365/45; 365/185.03; 365/185.19; 365/185.29; 365/189.07
[58] Field of Search ................................ 365/45, 185.03, 365/185.19, 185.29, 189.07

[56] References Cited

U.S. PATENT DOCUMENTS

| | | |
|---|---|---|
| 4,054,864 | 10/1977 | Audaire et al. . |
| 4,094,007 | 6/1978 | Minami . |
| 4,890,259 | 12/1989 | Simko . |
| 4,910,706 | 3/1990 | Hyatt ..................................... 365/45 X |
| 4,989,179 | 1/1991 | Simko . |
| 5,126,967 | 6/1992 | Simko . |
| 5,164,915 | 11/1992 | Blyth . |
| 5,175,706 | 12/1992 | Edme . |
| 5,218,571 | 6/1993 | Norris . |
| 5,220,531 | 6/1993 | Blyth et al. . |
| 5,239,500 | 8/1993 | Oguey . |
| 5,241,494 | 8/1993 | Blyth et al. . |
| 5,243,239 | 9/1993 | Khan et al. . |
| 5,289,401 | 2/1994 | Shima . |
| 5,294,819 | 3/1994 | Simko . |
| 5,352,934 | 10/1994 | Khan . |
| 5,388,064 | 2/1995 | Khan . |
| 5,444,656 | 8/1995 | Bauer et al. . |
| 5,508,958 | 4/1996 | Fazio ................................. 365/185.19 |

FOREIGN PATENT DOCUMENTS

57-176598  10/1982  Japan .

*Primary Examiner*—Huan Hoang
*Attorney, Agent, or Firm*—Blakely, Sokoloff, Taylor & Zafman LLP

[57] ABSTRACT

An integrated circuit which operates to store an input analog signal within an analog storage device such as an EEPROM is disclosed. Initially, a target voltage is determined for applying to the memory cell with the target voltage set to about 90% of the input analog signal voltage. A high voltage ramp is applied to the memory cell to set the voltage of the memory cell to the target voltage. A read operation is simultaneously performed while the high voltage ramp is applied to detect the voltage stored on the cell and to terminate the application of the high voltage ramp once the target voltage is reached. Thereafter, a normal read operation is performed on the memory cell to detect the actual voltage of the cell. A new target voltage is determined based upon the actual voltage of the memory cell and the input analog signal voltage. The high voltage ramp is again connected to the memory cell to set the cell to the new target voltage while a simultaneous read operation is performed. The "read-while-writing" operations are performed a predetermined number of times to achieve precise programming of the cell. Different embodiments are disclosed.

28 Claims, 11 Drawing Sheets

INTEGRATED CIRCUIT SYSTEM FOR ANALOG SIGNAL STORING AND RECOVERY INCORPORATING READ WHILE WRITING VOLTAGE PROGRAM METHOD

This is a divisional application of application Ser. No. 08/306,266, filed Sep. 14, 1994, now U.S. Pat. No. 5,629,890.

BACKGROUND OF THE INVENTION

1. Field of the Invention

The invention generally relates to the field of integrated circuit analog storage devices and in particular to a method and apparatus for performing voltage program operations within analog storage cells thereof.

2. Description of Related Art

U.S. Pat. No. 4,890,259 discloses a nonvolatile, high-density integrated circuit analog circuit recording and playback system wherein an analog input signal is sampled a plurality of times and then, as additional samples are being taken and temporarily held, a prior set of samples of the analog signal are parallel loaded into a plurality of storage sites, or cells, each comprising nonvolatile floating gate memory cells, preferably EEPROM cells. In that system, writing of the groups of samples into the respective storage cells is performed by iteratively providing a write pulse followed by a read operation for the respective cells to compare the information stored in each cell with the information held by the respective track and hold circuit. During successive write/read operations, the write pulse is increased in amplitude, with the write pulses to any cell being stopped or decoupled from the cell, after the information read from the cell in a previous read operation approximately equals the value held in the respective track and hold circuit.

U.S. Pat. No. 4,989,179 describes the use of analog memory in order to store digital data as multi-level analog information. Also described is an organization of the array of analog memory.

U.S. Pat. No. 5,126,967 provides an improvement to the system of U.S. Pat. No. 4,890,259 wherein one or more referenced storage columns are included in the array at each side of the storage side array and are used to store a reference signal at the same time that the adjacent storage cell stores a signal sample. During playback, the stored referenced signals are read back and weighted relative to each other in accordance with the relative column position of the signal storage cell being simultaneously read, with the output signal being taken as the difference between the sample signal read back and the reference signal read back (as weighted relative to each other as per the position in the row of the signal cell).

U.S. Pat. No. 5,241,494 also provides an improvement to the system of U.S. Pat. No. 4,890,259. In the system of U.S. Pat. No. 5,241,494, a multi-level iterative write process is provided for achieving programming of the analog storage cells with high-resolution. In particular, a coarse cycle of increasing voltage pulses are applied to a cell being written to quickly set the voltage of the cell to near a target voltage. The coarse cycle is achieved by employing a voltage ramp having a fairly steeply increasing voltage. During a subsequent fine cycle of recording, the stored voltage is fine-tuned by applying iterative pulses based on a voltage ramp having a more gradual voltage increase.

In each of the foregoing, a read operation is performed on each EEPROM cell after each respective voltage pulse is applied to determine whether the resulting voltage of the EEPROM cell is close to or exceeds a target voltage. If the resulting voltage exceeds the target voltage, the cell is said to be over-programmed. In the systems described, over-program can be corrected only by completely clearing the over-programmed cell and repeating the entire iterative write process to that cell. To avoid the need to dear a cell and repeat the iterative storage operations, slight amounts of over-program or under-program of the voltage are tolerated, thus resulting in less resolution than could theoretically be achieved. It would be desirable to provide an improved method for programming the voltage of analog storage cells wherein a higher degree of resolution may be achieved.

This improved resolution is useful for storage of digital data as multi-level analog information.

A program method which could operate more quickly by requiring fewer high voltage write operations is desirable since a smaller more economic embodiment results with fewer column driver circuits for the same sample rate.

When high speed programming is the system objective, then the number of high voltage write operations must be minimized.

SUMMARY OF THE INVENTION

In accordance with one aspect of the invention, an improved method and apparatus for programming an analog voltage cell is provided wherein over-program of each cell is substantially avoided, in part, by reading the analog cell simultaneously while it is being written. By reading the analog cell while it is being written, potential over-program of the cell is detected almost immediately and the write operation is terminated before any significant over-program occurs. As such, a greater degree of resolution may be achieved in accordance with the invention than is achieved in analog storage systems wherein a separate read operation is performed at the completion of each write operation. Herein the step of reading the stored voltage as it is being written is referred to as a "read-while-writing" step.

In one embodiment of the invention, the foregoing is implemented using a non-volatile analog storage cell as follows. Initially, an input analog voltage signal to be stored is received. A target voltage for applying to the storage element is determined based on the input voltage with the target voltage set to a level which is somewhat less than the input voltage. A high voltage ramp signal is then applied to the storage element for increasing the voltage of the storage element. The voltage level of the storage element is simultaneously read to determine whether the voltage level exceeds the target voltage and, if so, the voltage ramp is deactivated. Thereafter, a normal read operation is performed for reading the voltage level of the storage element. The target voltage is then increased by an amount proportional to any remaining difference between the stored voltage and the input voltage. The steps of applying the high voltage ramp while simultaneously reading the voltage level and then increasing the target voltage by an appropriate amount are repeated either a predetermined number of times or until any remaining difference between the stored voltage and the input voltage is less than a predetermined value.

Hence, the application of each individual high voltage ramp is terminated by sensing the voltage of the cell while the voltage ramp is applied. A second, separate, read operation is performed to read the resulting voltage on the cell for comparison with the input voltage level such that further target voltage levels may be adaptively set based on the previous target analog signal, the actual voltage of the storage cell and the input analog signal level.

In an exemplary embodiment, the target voltage is initially set to about 90% of the input voltage level. Thereafter, the target voltage is increased by about 90% of any remaining difference between the input voltage level and the voltage level read from the storage cell. The process of determining a target voltage then applying a voltage ramp while simultaneously reading the storage element is performed four to six times. Also in the exemplary embodiment, the storage cell is a conventional EEPROM cell modified to allow the cell to be simultaneously read while the high voltage ramp is applied thereto. An additional electrical contact is provided to the EEPROM cell in addition to those employed within conventional EEPROM cells to allow the simultaneous read operation In another exemplary embodiment, two EEPROM cells are provided for storing each individual input signal value as a voltage difference between the two EEPROM cells. The aforementioned steps for storing an analog voltage level are applied to both cells (although modified somewhat to store the input signal as a voltage difference). After completion of the predetermined number of storage cycles, the resulting difference in voltage levels of the two cells is determined and compared to the input voltage level. If the difference between the analog voltages of the two cells does not precisely equal the input analog signal level, then the voltage level of one or both of the pair of cells is increased by an amount sufficient to yield a difference which more closely corresponds to the input voltage. Thereafter, a read operation is performed by reading and differencing the voltage levels from both of the cells. In this manner, an even greater degree of precision and resolution is achieved.

Since improved accuracy is realized, the invention is advantageously employed in systems storing analog signals such as temperature, pressure, vibration, voice or music signals. However, the invention may also be employed in systems for storing digital information. In such systems, discrete analog signal levels such as multi-level voltages are defined within each cell for representing digital information. For example, four or two hundred fifty-six levels are defined within each storage cell for storing, respectively, two or eight bits of information per cell. In this manner, a far greater storage density can be achieved than in digital storage devices wherein each individual storage element stores only a single bit of information. The high degree of resolution achieved by employing the voltage programming method of the invention allows for reliably defining the discrete levels to thereby allow the high storage density.

By reducing the number of high voltage write operations needed, the invention allows for storing analog voltages more quickly. This increased speed enables new applications and reduced cost.

DETAILED DESCRIPTION OF THE INVENTION

Referring to the figures, preferred and exemplary embodiments of the invention will now be described. The embodiments of the invention described below are related to systems described in U.S. Pat. Nos. 4,890,259; 4,989,179; 5,126,967; and 5,241,494, all of which are assigned to the assignee of the present application, and each of which is fully incorporated by reference herein.

An analog integrated circuit incorporating the invention will be described with reference to FIG. 1, then aspects of the read-while-writing circuitry will be described with respect to the remaining figures. FIGS. 8 through 12 provide circuit schematics for certain components of the system illustrated in the figures, and specific reference will be made occasionally to FIGS. 8 through 12.

Figure 1:
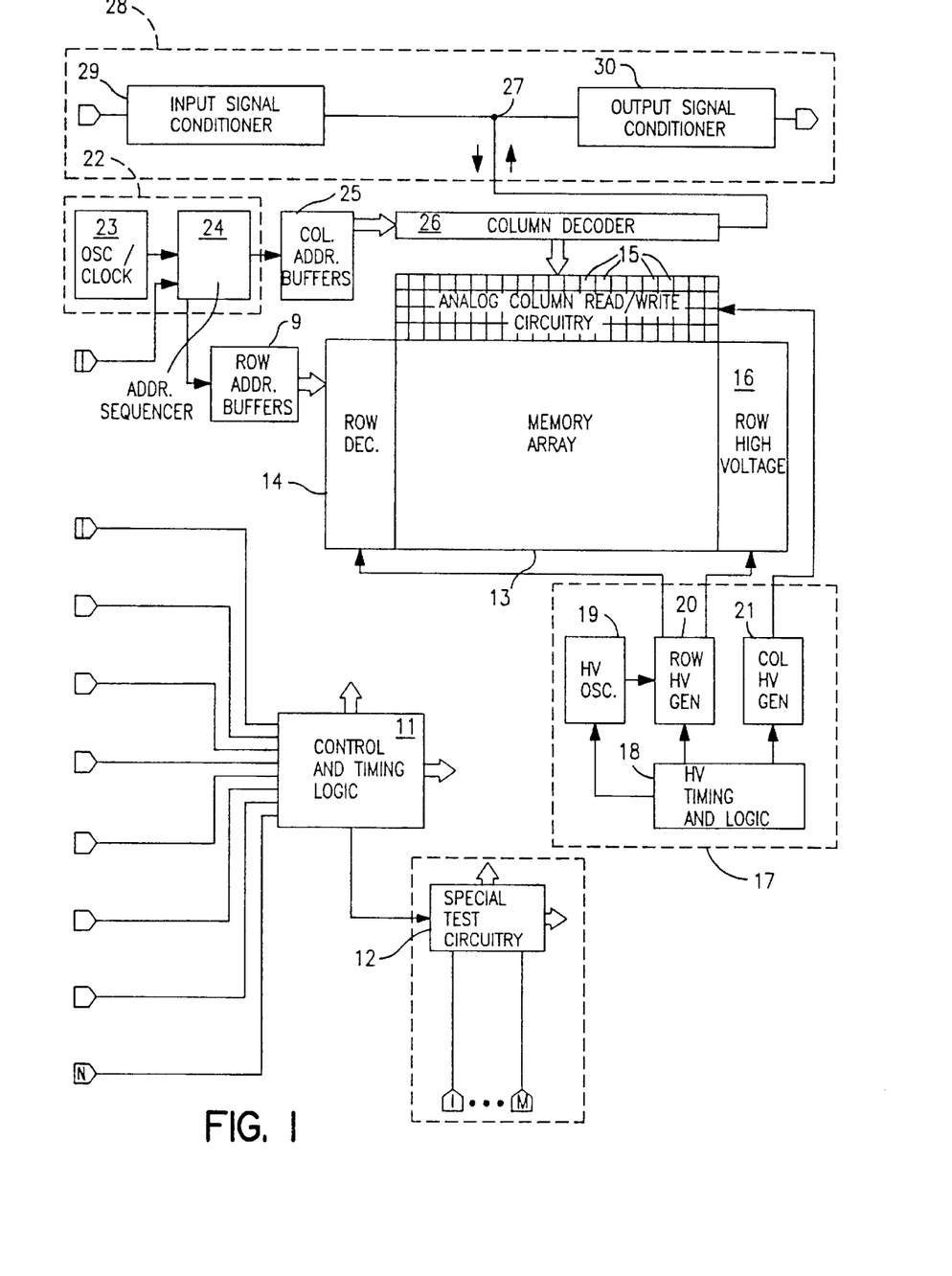
FIG. 1 is a block diagram of an analog storage system configured in accordance with present invention.

FIG. 1 shows the analog integrated circuit storing and recovery system of the invention. Control input signals are coupled to control and timing logic circuitry 11, and may be implemented as a microprocessor compatible serial interface. Control and timing circuitry 11 coordinates the various components of the storing and recovery system and is also coupled to test circuitry 12. Test circuitry 12 is not an essential component of the system, but such circuitry is common for evaluation and testing to detect errors in the control and timing logic circuitry, to avoid the faulty components and to speed up testing of the memory array.

Central to the system is memory array 13. Memory array 13 has rows and columns of non-volatile memory cells, preferably EEPROM cells. Bordering memory array 13 is a row decoder 14 and analog read/write circuitry 15 used to control the column drivers. Memory array 13 uses page mode addressing whereby row decoder 14 activates a particular row and the read/write column drivers 15 sequentially access the individual cells of the activated row.

Memory array 13 also is adjacent to row high voltage circuitry 16, which provides high voltage levels to an activated row for recording or writing. A high voltage generator circuit 17 is also provided for generating the recording voltages. Generator 17 includes high voltage timing and logic circuit 18 coupled to high voltage oscillator 19, row high voltage generator 20 and column high voltage generator 21 for providing timing signals used for recording. High voltage oscillator 19 is coupled to row high voltage generator 20 and to column high voltage generator 21 to provide timing for the row and column generators. Row high voltage generator 20 is coupled to row high voltage circuitry 16. Column high voltage generator 21 is coupled to read/write column drivers 15.

The system of the invention is synchronous, timed by a clock addressing sequencer 22 which includes a combined clock and oscillator 23 and an addressing sequencer 24. These provide for timed generation of addresses from sequencer 24. The timed generation of addresses combined with page mode addressing enables the system to store analog information in real time. An optional input to addressing sequencer 24 permits event triggered storing of signals. Address sequencer 24 is coupled to column address buffers 25 and to row address buffers 9. These buffers are intermediaries between address sequencer 24 and row and column decoders 14 and 15, respectively. Row address buffers 9 provide the row addresses to the row decoder 14. Column address buffers 25 provide, through column decoder 26, the addresses of read/write column drivers 15 that are to be accessed. Column decoder 26 is coupled to read/write column drivers 15.

Column decoder 26 is also coupled to node 27 of I/O interface device 28. I/O interface device 28 includes an input signal conditioner 29 and an output signal conditioner 30.

I/O interface device 28 provides a mechanism for translating an analog input signal from a transducer to a signal capable of being directly stored on a memory cell without A-to-D conversion, as well as for translating stored analog information to a form appropriate for driving an output transducer without D-to-A conversion. For sound information, the input and output transducers would be a microphone and a speaker.

Figure 2:
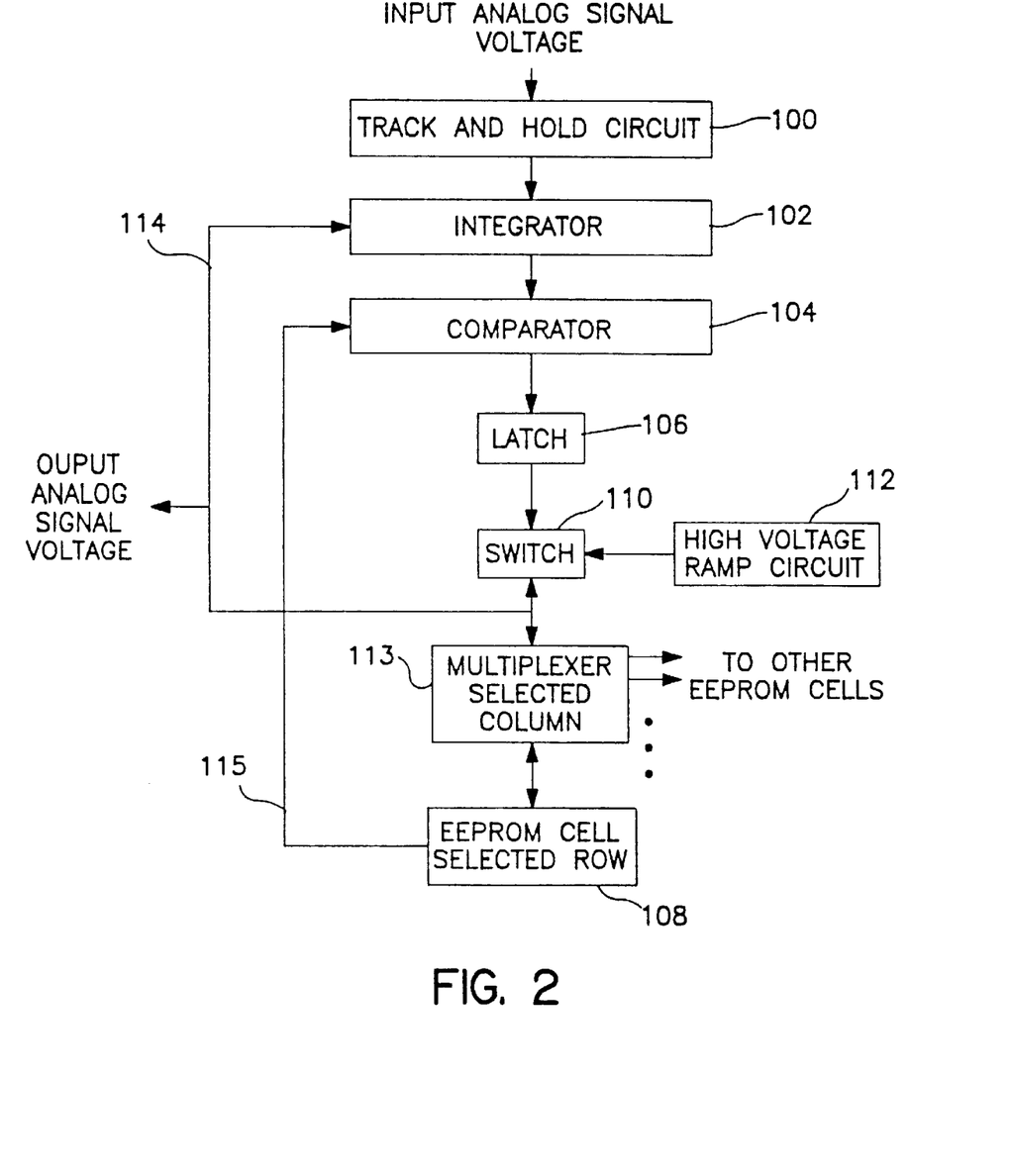
FIG. 2 a block diagram of portions of the system of FIG. 1, particularly portions related to the "read-while-writing" aspects of the invention, wherein an analog signal is stored in a single EEPROM.

FIG. 2 illustrates pertinent portions of analog column read/write circuitry 15 and memory array 13 of FIG. 1 which are particularly configured for programming of the voltage stored within one EEPROM cell. In particular, FIG. 2 illustrates a track and hold circuit 100, an integrator 102, a comparator 104, and a latch 106, each of which is a portion of the analog column read/write circuitry 15 of FIG. 1. FIG. 2 also illustrates a single EEPROM cell 108 connected through a multiplexer 113 and a switch 110 to a high voltage ramp source 112. An output of latch 106 is connected to switch 110 for controlling the application of a high voltage to EEPROM cell 108. Multiplexer 113 allows the high voltage signal to be applied to one of the EEPROM cells of a single column of cells. In FIG. 2, only one of the EEPROM cells of the column is specifically illustrated. Application of the high voltage ramp signal to the EEPROMs of the column is time multiplexed to allow signals to be sequentially stored in all cells of the column.

In use, an input voltage corresponding to an analog signal level to be stored is received by track and hold circuit 100 from column decoder 26 (FIG. 1). Track and hold circuit 100 samples the input analog signal and holds the signal at a fixed voltage to which EEPROM cell 108 is to be set to. The sampled voltage, held by track and hold circuit 100, is transmitted to integrator 102 which operates to determine a target voltage for applying to EEPROM cell 108. The target voltage is initially set to a value less than the sampled voltage value such as, for example, 90% of the sampled voltage value.

The target voltage is transmitted to comparator 104 which compares the target voltage with the current voltage held within the EEPROM cell which initially may be zero. The current voltage of the EEPROM cell is provided to comparator 104 along a connection line 115. As will be described more fully below, the voltage provided to the comparator along line 115 is determined during a "read-while-writing" operation which is separate from a normal read operation. Comparator 104 outputs a signal which indicates whether the target voltage exceeds the voltage of the EEPROM cell. The signal output from the comparator is fed through latch 106 for controlling switch 110. So long as the target voltage is greater than the voltage output from EEPROM cell 108 along line 115, switch 110 remains dosed to allow a high voltage ramp signal to be applied to the EEPROM cell for uniformly increasing the voltage of the cell. Once the voltage of the cell reaches the target voltage, the output signal from comparator 104 changes state causing latch 106 to open switch 110, thereby disconnecting the high voltage ramp from the EEPROM cell. In this matter, the EEPROM cell is set to a voltage value substantially identical to the initial target voltage value.

Thereafter, a normal read operation is performed on EEPROM cell 108 and the read voltage is conveyed, along a connection line 114, to integrator 102 which operates to determine a new target voltage. More particularly, integrator 102 operates to determine the difference between the sampled voltage and the voltage provided along line 114 and to define a new target voltage equal to, for example, the initial target voltage plus 90% of any remaining difference between the stored voltage and the sampled voltage. In other words, the new target voltage is set to about 99% of the sampled voltage. The actual level of the new target voltage may differ somewhat from 99% depending upon the actual voltage stored within EEPROM cell 108 which may vary as a result of temperature and other factors. The new target voltage is then applied to comparator 104 and the foregoing steps are repeated to again apply the high voltage ramp to EEPROM 108 for increasing the voltage held therein to the new target voltage. As before, a read-while-writing voltage is output from EEPROM cell 108 and transmitted along line 115 to comparator 104. Once the EEPROM cell reaches the new target voltage, latch 106 again operates to open switch 110 thereby deactivating the high voltage ramp. A normal read operation is again performed to determine the actual voltage held within EEPROM cell 108 and the "normal" read voltage is transmitted along line 114 to integrator 102.

Another new target voltage is calculated by integrator 102 with the new target voltage being equal to the sum of the previous target voltages plus, for example, 90% of any remaining difference between the sample voltage and the actual voltage held within EEPROM 108. The new target voltage is again applied to the EEPROM while a read-while-writing voltage is simultaneously output from the EEPROM.

The overall sequence of storage cycles wherein target voltages are determined and applied to EEPROM cell 108 are performed a predetermined number of times and may be performed, for example, four to six times. The actual number of times for any particular system implementation may be determined based on the particular needs and constraints of the system and is preferably chosen to yield the best trade-off between speed and accuracy. Too few cycles may result in the cell being under-programmed. Too many cycles may result in a needless amount of time spent and further results in a risk of over-programming. Although it is advantageous to define a predetermined number of cycles, in other implementations it may be desirable to allow the total number of cycles to be dynamically, and perhaps adaptively, controlled. For example, additional circuitry may be provided which compares the actual EEPROM cell voltage to the sample voltage and terminates the write cycles once the difference therebetween decreases below a minimum predetermined threshold.

Although FIG. 2 illustrates only a single EEPROM cell, the foregoing operations are applied to all cells within the analog storage device. The cells are arranged in columns and rows with each group of columns having a column driver which contains a separate track and hold circuit, integrator circuit, comparator, latch and multiplexer.

A small number of reference cells (not shown) may be provided for storing a reference voltage for improving the effective performance of the track and hold circuits and for improving rejection of various disturbances. Overall read accuracy can be further improved by using the reference cells to remove temperature variation errors. In particular, the stored referenced cell is forced to the reference voltage during the read. The value of the voltage on a dear gate of the EEPROM cell (described in more detail below with a reference to FIG. 5A) is adjusted during the read to thereby restore the reference voltage to the correct value. At the same time, all voltages from the row containing the EEPROM cell are also restored. These voltages can be read back continuously with the temperature variation errors thereby removed. Furthermore, better temperature compensation can be achieved for cells recorded at different temperatures by using a reference cell for each EEPROM cell. Such may be required for systems which store samples with in a single row which are recorded at widely spaced time intervals. The array can be recorded one cell pair at a time, with each pair having one reference cell and one signal cell. Slight over-program of the signal cell can be corrected by slight additional program of the paired reference cell. For example, by employing a pair of cells to store each value, temperature variations or other errors can be corrected during both storage and output of the analog signals. One of each pair of cells is employed as a reference cell. The clear gate voltage of the reference cell is adjusted to correct for the temperature variation or other errors. In this regard, the reference cell arrangement illustrated in FIG. 5B may be employed. A particular arrangement of EEPROM cells incorporating reference cells is illustrated in FIG. 1 of U.S. Pat. No. 5,126,967 and the features illustrated therein, which relate to the provision of reference storage columns, may be employed within integrated circuit embodiments of the present invention as well. Many of the details of the arrangement of columns of EEPROM cells and of the reference column of cells are not pertinent to the present invention and therefore will not be described in detail herein.

It should be noted that each write high voltage ramp should be carefully controlled so that each cycle of the write high voltage is substantially identical. In particular, the EEPROM cell should be exposed to identical conditions each cycle of the write high voltage ramp except for the value of the target voltage and the charge stored in the EEPROM cell. As such, if the target voltage is held constant from one cycle to the next, the output of the EEPROM cell while the high voltage ramp is applied will reach the target voltage before any additional charge is placed onto the EEPROM cell. Hence, no further writing of the cell will occur because the EEPROM cell will have reached the target voltage at its output before any changes can be made to the stored voltage. If the cell becomes slightly overprogrammed, then the target voltage is preferably reduced during the next cycle. This ensures that no further change to the voltage of the EEPROM will be made by additional write cycles.

Figure 3:
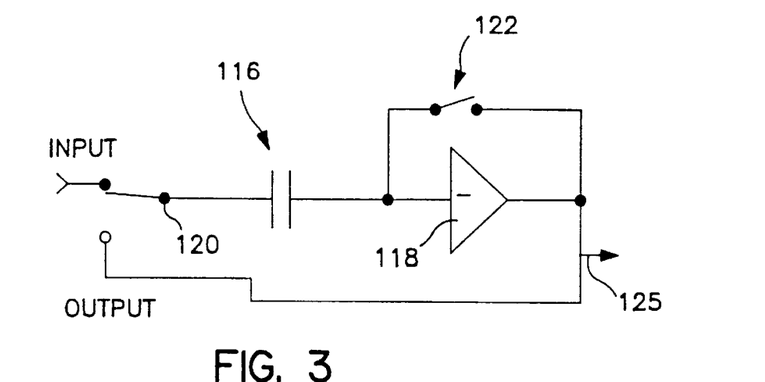
FIG. 3 is a schematic illustration of a track and hold circuit of the system of FIG. 2.
Figure 4:
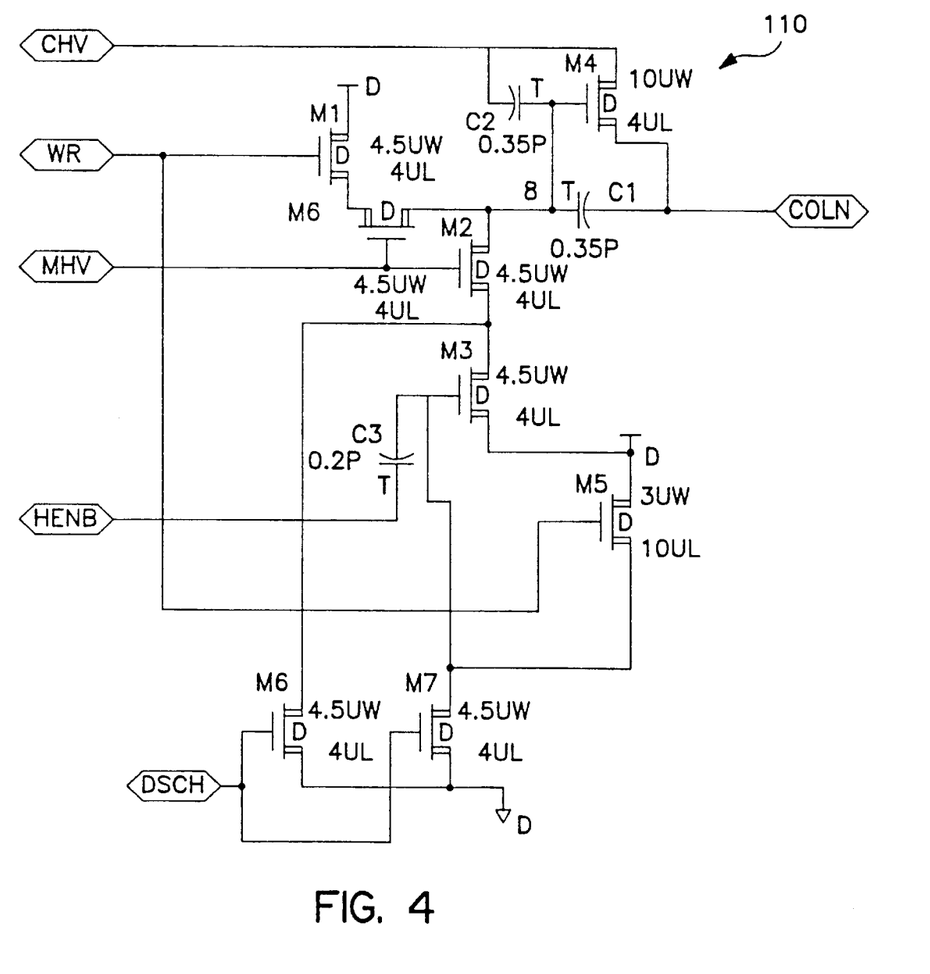
FIG. 4 a circuit schematic of a high voltage power switch circuit of the system of FIG. 2.
Figure 5A:
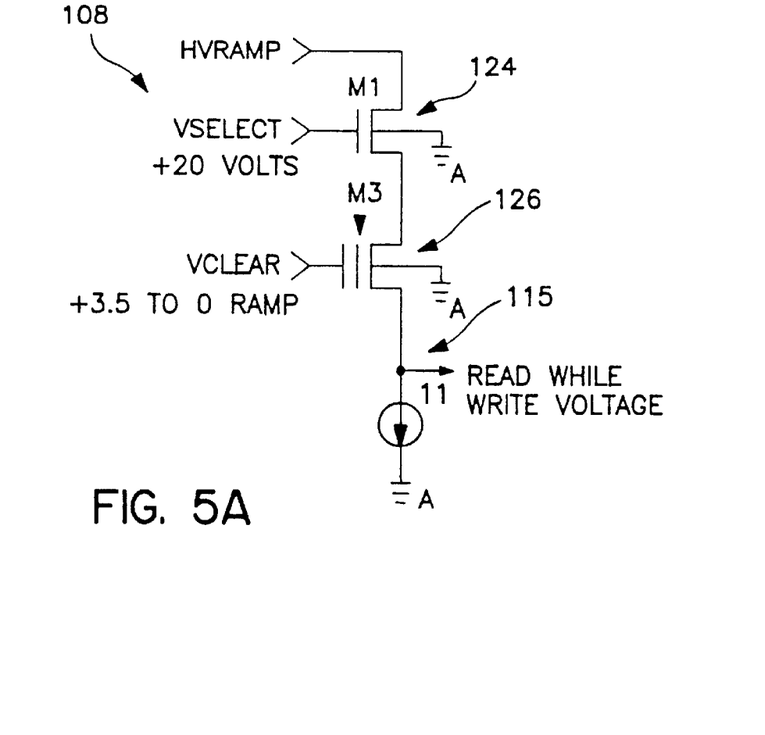
FIG. 5A is a circuit schematic of a first embodiment of a "read-while-writing" EEPROM of the system of FIG. 2.
Figure 5B:
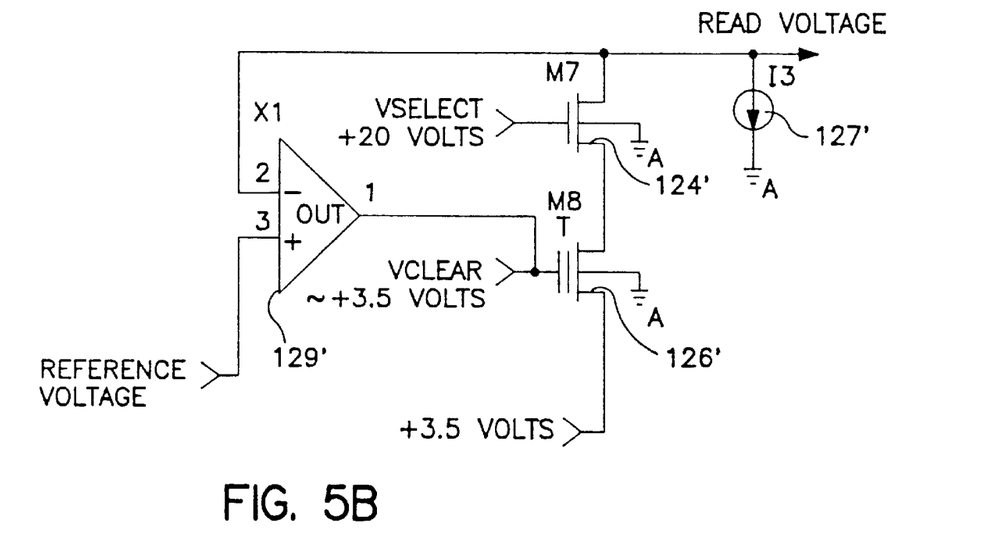
FIG. 5B is a circuit schematic of a second embodiment of a "read-while-writing" EEPROM of the system of FIG. 2, configured to perform a temperature corrected read.

Thus the method for programming the analog voltage value performed by the system of FIG. 2 operates to adjust the stored voltage based on the input voltage and on the actual voltage stored in the cell. The method therefore is an adaptive method. Hence, even when many cells are being written at the same time, individual cell variations are automatically compensated. Referring Referring to FIGS. 3–5, details of the components of FIG. 2 will now be set forth. FIG. 3 illustrates track and hold circuit 100 implemented as a switched capacitor track and hold circuit including a capacitor 116 and an operational amplifier 118. Capacitor 116 is connected through a switch 120 to an input voltage line (FIG. 2). Capacitor 116 is also connected to the inverting input of operational amplifier 118. A second switch 122 is connected which bypasses operational amplifier 118 between capacitor 116 and an output line 125 connected to integrator 102 (FIG. 2). Switch 120 can also connect capacitor 116 directly to output line 125.

During a track interval, switch 120 is controlled to connect the input line to capacitor 116 while switch 122 is kept closed thereby storing both the offset voltage and the input onto the capacitor. During a hold interval, switch 120 is controlled to connect capacitor 116 to output line 125 while switch 122 is left open. The offset voltage of the operational amplifier is completely canceled by this configuration. However, the charge feed through of switch 122 is not canceled and such may limit accuracy of the stored value. Accordingly, a minimum gate area switch is preferably used. Storage capacitor 116 preferably has a high capacitance, such as 5 picofarrads (PF). The high capacitance helps achieve both a long hold time and high accuracy.

Another capacitor (not shown) may also be provided between output 125 and switch 120 to prevent unwanted transients on output 125. With a suitable choice of capacitance, the presence of the additional capacitor will not change the desired operation of the circuit.

Figure 8:
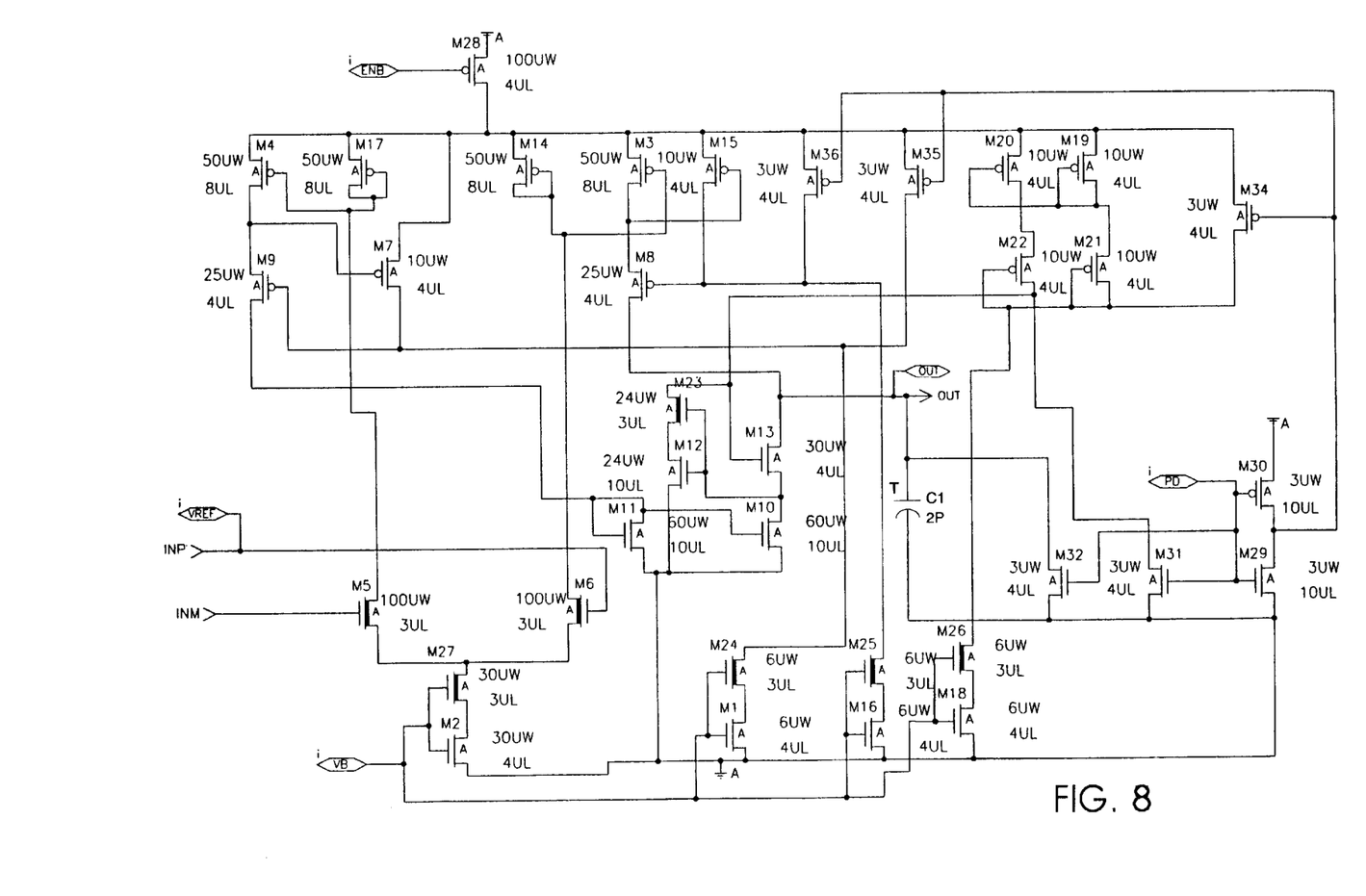
FIGS. 8 and 9 are a circuit schematic illustrating an exemplary implementation of the integrator of FIG. 1.
Figure 9:
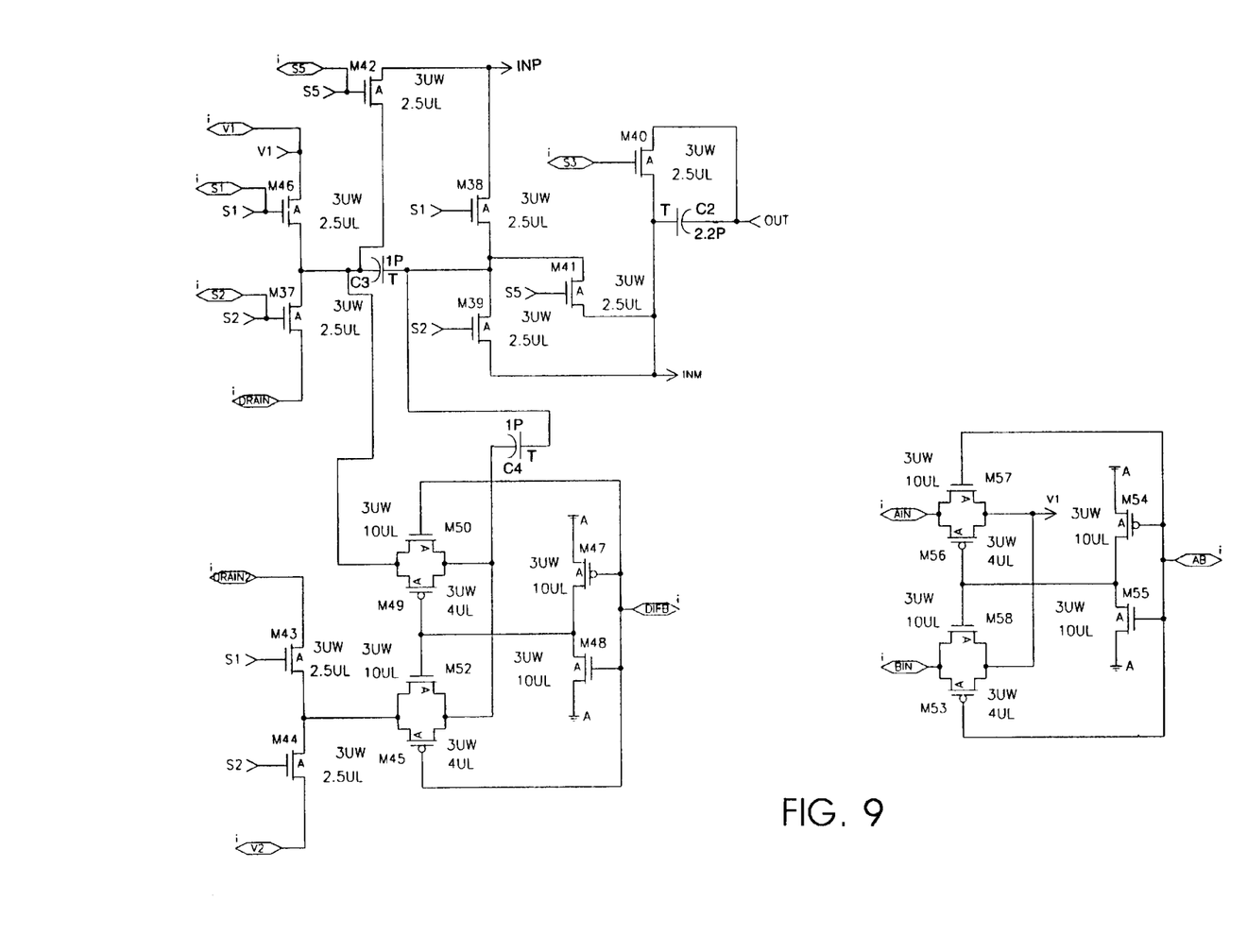
Figure 10:
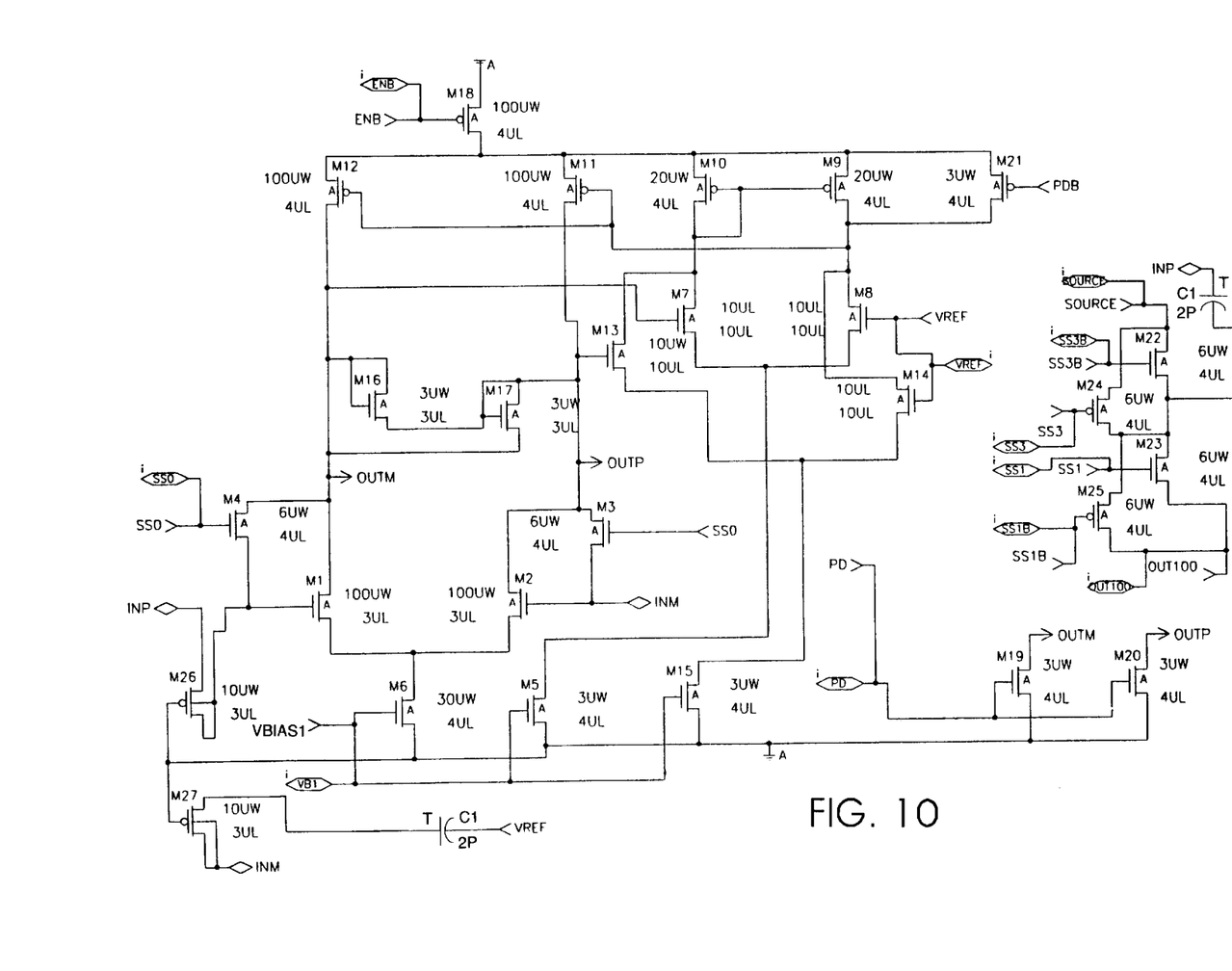
FIGS. 10, 11, and 12 are a circuit schematic illustrating an exemplary implementation of the comparator of FIG. 1 having three different gain stages.
Figure 11:
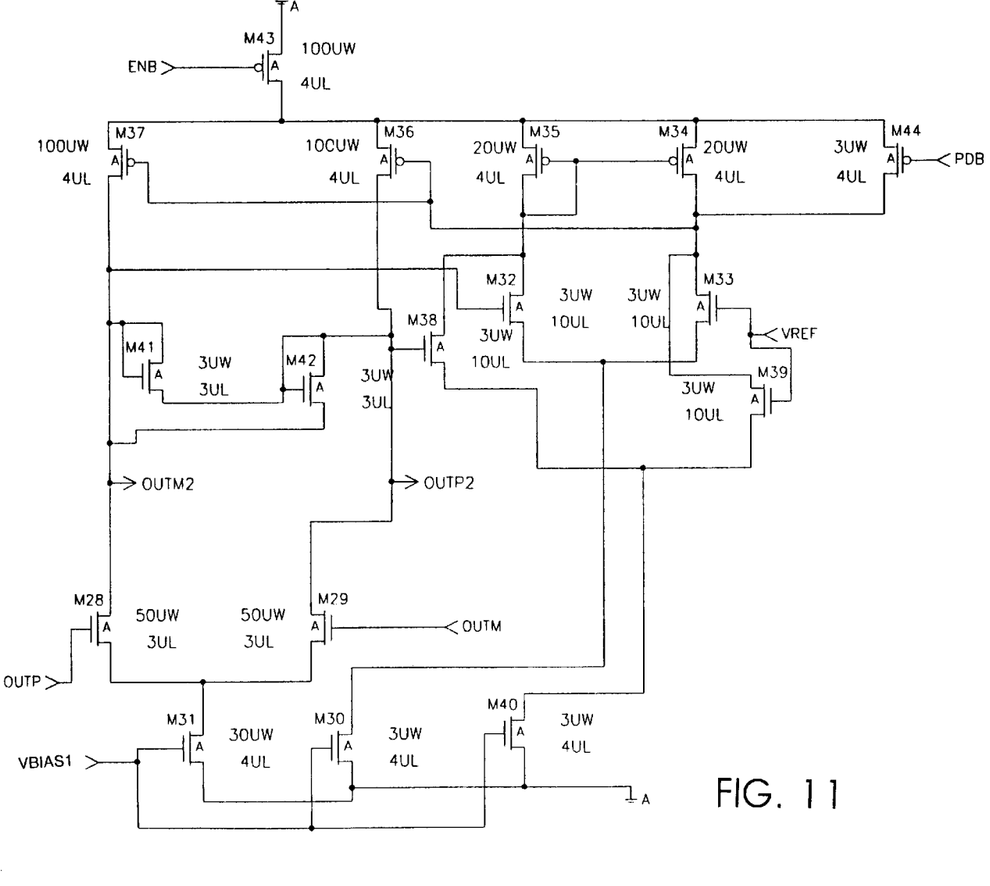
Figure 12:
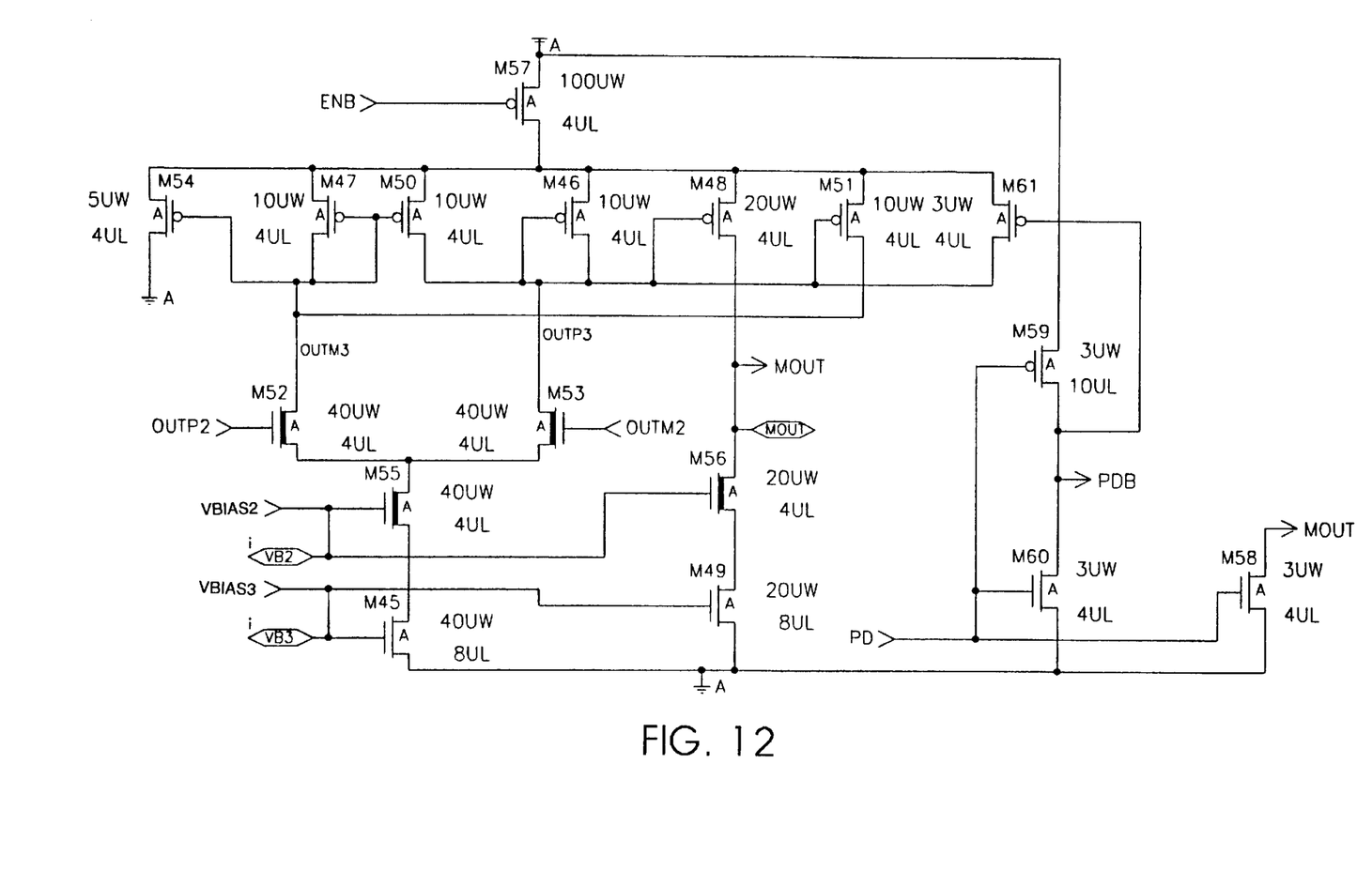

Circuit schematics of an exemplary implementation of integrator 102 are also set forth in FIGS. 8 and 9. With brief reference to elements within FIGS. 8 and 9, when a logic input "DIFB" is held high, then capacitors C3 and C4 are connected together and a voltage difference between "V1" and "DRAIN" is used to increment the new target voltage on the output. Control signals S1 and S2 sample the two input voltages "V1" and "DRAIN" and force charge into node "INM" which is the amplifier input. Since the gain of the amplifier is very large, the feedback capacitor C2 provides an opposite charge. This action changes the output voltage by a voltage proportional to the capacitor ratio of the sum of C3 and C4 divided by C2. The ratio should be less than one and may be set to 0.9. This is the configuration used for a program such as in FIG. 2.

Referring again to FIG. 2, column comparator 104 will now be briefly described. Comparator 104 is a high gain and high speed comparator used to turn off the voltage ramp applied to the EEPROM cell being programmed. Such occurs during the read while write interval of the overall write cycle. The read while write interval may be a very "noisy" interval. Hence, comparator 104 preferably includes three differential gain stages (not specifically shown in FIG. 2) for improving rejection of both ground and power supply noise. An exemplary embodiment of comparator 104 having the three differential gain stages is set forth in FIGS. 10, 11 and 12.

High voltage power switch 110 will now be described with reference to FIG. 4 which provides an exemplary embodiment As noted above, the function of switch 110 is to apply a high voltage to the cell being programmed (through column multiplexer 113). In the circuit of FIG. 4, the high voltage is identified as the CHV column high voltage produced by a charge pump (not shown) as a 0 volt to 20 volt 100 microsecond ramp the pump repeats at a 125 microsecond rate. Switch 110 is a bootstrapped high side switch with three logic controls and a single output COLN.

Briefly, considering some of the features of the circuit of FIG. 4, control signals employed are WR (a write signal) and HENB (a high voltage enable bar signal). For a write operation, WR is high with HENB low and CHV also low. This state charges a bootstrap C2 capacitor to about four volts positive on node 8. The voltage on CHV is then increased until a desired write voltage is present on the source of the programmed cell. HENB is driven high by latch 106. This state rapidly discharges node 8 to five volts. This voltage prevents further programming but is still high enough to prevent M4 from drawing current due to gated diode breakdown.

For read operation, the gate voltage on M4 is driven to 0 volts. This state prevents any current flow between CHV and COLN during the read. To enter this state, WR is brought low, then DSCH is driven high. No steady power supply current is drawn.

The HENB signal is applied through C3 to discharge node 8. During DSCH high the signal HENB should be returned to low. This charges C3 while node C3B is held at VSS by DSCH. During the read operation, the DSCH signal should be high to assure that M4 is held off.

Referring again to FIG. 2, multiplexer 113 will now be further described. Multiplexer 113 is connected to each column of the array for allowing the voltage provided by high voltage ramp circuit 112 through switch 110 to be independently applied to each EEPROM cell 108 within a column. Each column has a separate multiplexer.

In an exemplary embodiment of multiplexer 113, each column has 32 cells requiring a 1:32 multiplexer. This may be implemented using an initial 1:4 select followed by four 1:8 selects.

Referring to FIG. 5A, EEPROM cell 108, will now be described. EEPROM cell 108 includes a source transistor 124 and a drain transistor 126. The high voltage ramp signal provided by ramp circuit 112 of FIG. 2 is applied to a source of transistor 124 which also receives a 20 volt select signal at its gate. Transistor 126 receives a 3.5 to 0.0 volt ramp clear signal at its gate. A "read while write" voltage line is connected to a drain of transistor 126 which is also connected to a current source.

During a write operation, the high voltage ramp signal is applied to the source of transistor 124 while the read while write voltage is simultaneously detected from the drain of transistor 126. In this manner, the voltage level held by EEPROM 108 is detected while the voltage level is being set. This is in contrast to typical EEPROM cells, such as those described within the patents referenced above, wherein a read operation cannot be performed simultaneously with a write operation. Within such EEPROM cells, there is no output connection to the drain transistor. Rather, the source transistor is either connected to a high voltage ramp or to a read voltage line. As such, the analog signal level stored within the EEPROM cell cannot be both read and written to simultaneously.

As noted, in one embodiment each column of the memory array includes thirty-two EEPROM cells. In that embodiment the read while write voltage line should be isolated every thirty-two cells to reduce the total capacitance on the line during the write. The select gate of the EEPROM cell of FIG. 5A is employed to isolate all other rows of the storage array (which may total, for example, 128). Preferably, the clear gate of transistor 126 is shorted with an implant for a lead connected to the read while write voltage line. Further isolation is achieved by providing an active layer, which isolates each group of thirty-two EEPROM cells to separate groups, i.e., to node up-and-down groups. By employing the select gate of the EEPROM cells to isolate every thirty-two cells and to thereby reduce the total capacitance on the line, increased writing speed is achieved.

Referring to FIG. 5B, an alternative embodiment of the EEPROM which provides for a temperature corrected read is illustrated. The embodiment of FIG. 5B is similar to that of FIG. 5A and like elements are identified with like reference numerals with primes. For the embodiment of FIG. 5B, a normal read connection line 125' is connected to the source of transistor 124' and to a current source 127 for performing a normal read operation. To provide a temperature corrected read, the normal read connection line 125' of a reference cell is connected through a comparator 129' to the VCLEAR gate of the cell with the comparator also receiving a reference voltage. The VCLEAR gate of the reference cell is common to an entire row of storage cells. By feeding the normal read voltage and a reference voltage through a comparator onto the VCLEAR gate, the voltage of the VCLEAR gate can be forced to a voltage selected to correct for temperature and other factors for the entire row of cells. This effectively allows continuous read operation. It should be noted that the normal read line illustrated in FIG. 5B is employed within the embodiment of FIG. 5A. However, for the embodiment of FIG. 5A, the normal read line is not routed through a comparator into the VCLEAR gate.

Figure 6:
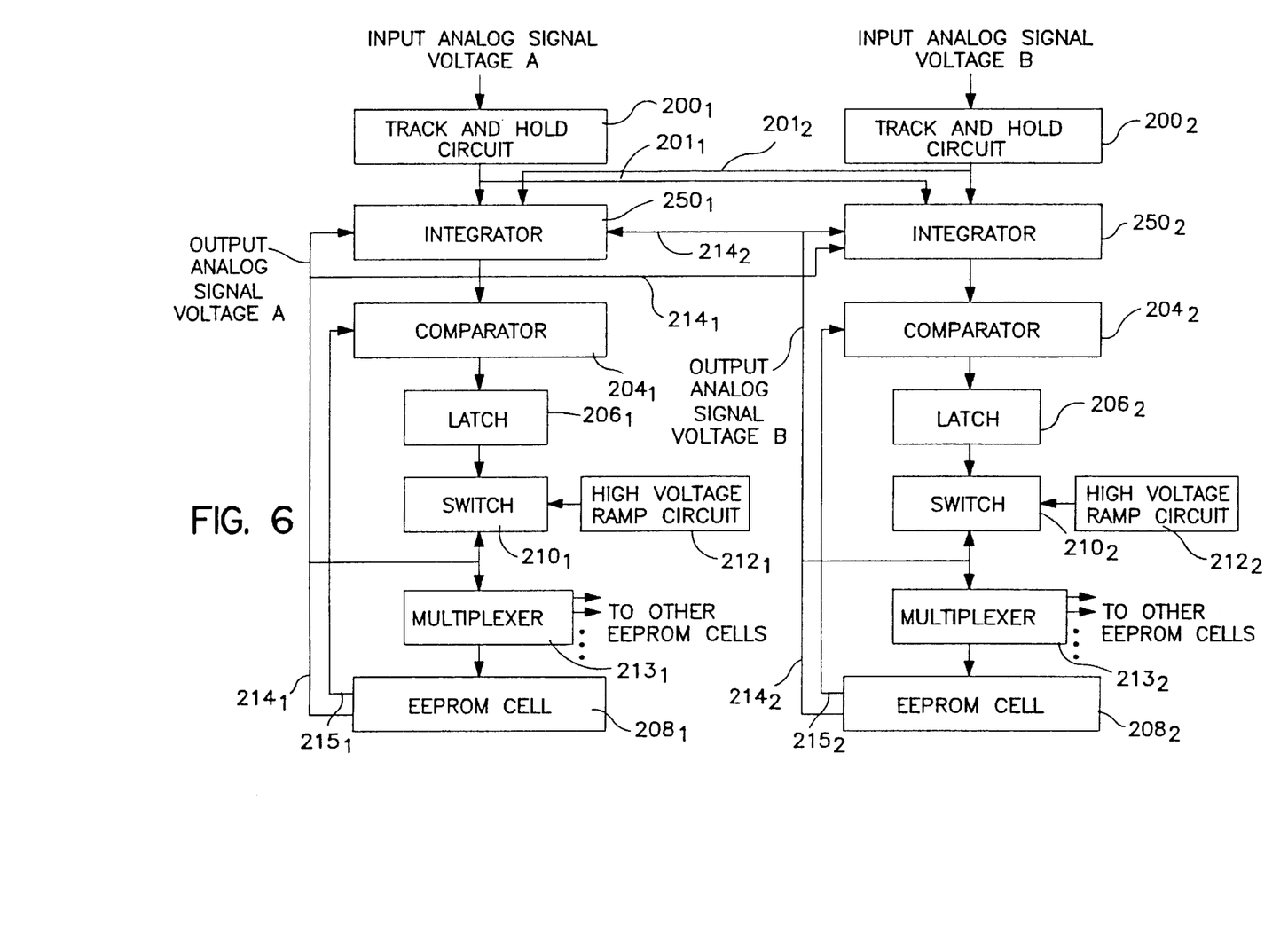
FIG. 6 is a block diagram of an alternative embodiment of the system of FIG. 2 wherein an analog signal is stored as a difference between voltages stored within two EEPROM cells.

What has been described thus far is a voltage program method and apparatus for use with a system wherein a single EEPROM cell is employed for storing each input signal value. Referring to FIG. 6, an alternative embodiment of the invention wherein a pair of EEPROM cells are employed to store each analog signal value as a difference voltage will now be described. The alternative embodiment of FIG. 6 is similar to the embodiment of FIGS. 2–5B and similar or identical components will not be re-described.

FIG. 6 illustrates two read-while-writing circuits similar to the single circuit of FIG. 2 but each including a modified integrator. Within FIG. 6, elements similar or identical to those of FIG. 2 are illustrated with like reference numerals incremented by 100. Elements of a first circuit are denoted with subscript 1 and elements of a second circuit are denoted with subscript 2. For example, the first of the pair of circuits includes a track and hold circuit $200_1$, a comparator $204_1$, a latch $206_1$, etc. The second of the pair of circuits includes a track and hold circuit $200_2$, a comparator $204_2$, a latch $206_2$, etc.

The modified integrators of the two circuits are respectively denoted $250_1$ and $250_2$. Whereas integrator 102 of FIG. 2 receives only two inputs, one from the track and hold circuit and the other from the EEPROM cell, integrators $250_1$ and $250_2$ each include two additional inputs. In particular, integrator $250_1$ receives input along a line $201_2$ from track and hold circuit $200_2$. Likewise, integrator $250_2$ receives input along line $201_1$ from track and hold circuit $200_1$. Integrator $250_1$, also receives input from EEPROM output line $214_2$ of the second circuit. Likewise, integrator $250_2$ receives input from line $214_1$ of the first circuit. Hence, each of the integrators receives input signals from its own track and hold circuit and EEPROM cell and also from the track and hold circuit and EEPROM cell of the other circuit. The function of modified integrators $250_1$ and $250_2$ is to improve the accuracy of the voltage difference stored into EEPROM cells. This difference voltage is driven to be equal to the voltage difference between separate input signals Voltage A and Voltage B.

A first set of write cycles are conducted as in the embodiment of FIG. 2. After a preselected number of cycles of writing, integrators $250_1$ and $250_2$ measure both the difference between its track and hold output and EEPROM "normal read" voltage and the track and hold output and "normal" read voltage of the paired cell. The difference values are subtracted one from the other value. This "difference of two differences" is used to adjust the target voltages at the output of the integrators to correct for any small under- or over- program of the pair of EEPROM cells. The ability to correct for small over program is a key to improved accuracy. If one of the input voltages is a reference voltage, then the output of that cell can be used to restore the exact voltage of the other input. If both inputs are employed as differential signals, then the voltage swing range of the output differential signal is twice as large as can be stored into a single EEPROM cell.

The comparator described "difference of two differences" may be implemented using the circuit of FIG. 9 when logic input "DIFB" is held low. As such, capacitor C4 is no longer connected together with C3, but is switched by two control signals S1 and S2 between "DRAIN2" and "V2". Because the two inputs to capacitor C3 are reversed, the difference voltage between the two inputs is subtracted from the output by the ratio of 0.45, C3 divided by C2. For the inputs "V1" and "DRAIN", the ratio of C4 divided by C2 is the same 0.45 value.

Both EEPROM cells $208_1$ and $208_2$ receive the same number of write cycles. The number of cycles can be selected by digital EEPROM program bits. Default values may be set to four cycles of regular write and one cycle of differential write. The differential write will always drive one target voltage up and the other down by the same amount. The intended operation is as a final very small adjustment of the read voltage difference between the two EEPROM cells.

Now some examples of the differential write operations performed by the system of FIG. 6 are provided.

If the two EEPROM cells are already set to be exactly correct when the differential write is commenced, then the two target voltages at the outputs of the integrators are not changed and the write operation is repeated. Since no change is made in the target voltages, little or no change is made in the charge stored in the EEPROM cells by the final write cycle and the final read voltage difference will be the desired value.

If one cell is exactly correct, but the other EEPROM cell has a read voltage slightly higher than desired, the target voltage of the correct EEPROM cell is increased slightly and the target voltage of the other cell is decreased by the same amount for the differential write cycle. This adjustment brings the read difference voltage between the two EEPROM cells closer to the desired value.

If one cell is correct and the other is still slightly low, then the target for the correct cell is decreased while the target for the low cell is increased for the write cycle.

If both cells are high or low by the same voltage, then the target voltages are not changed since the read difference voltage is correct.

Hence, once the additional write cycles are performed, the difference voltage between the two EEPROM cells $208_1$, and $208_2$ very precisely matches the input analog signal voltage. Thereafter, any read operations are performed from both EEPROM cell $208_1$, and EEPROM cell $208_2$ and the difference voltage is determined therefrom. In an alternative embodiment, not shown, the input analog signal voltage may be stored as an average of the voltages of the two cells. The supplemental programming cycles, described immediately above, may be employed in such an embodiment to adjust the voltage of one of the cells by a selected amount such as the average between the two voltages precisely matches the input analog signal voltage.

Figure 7:
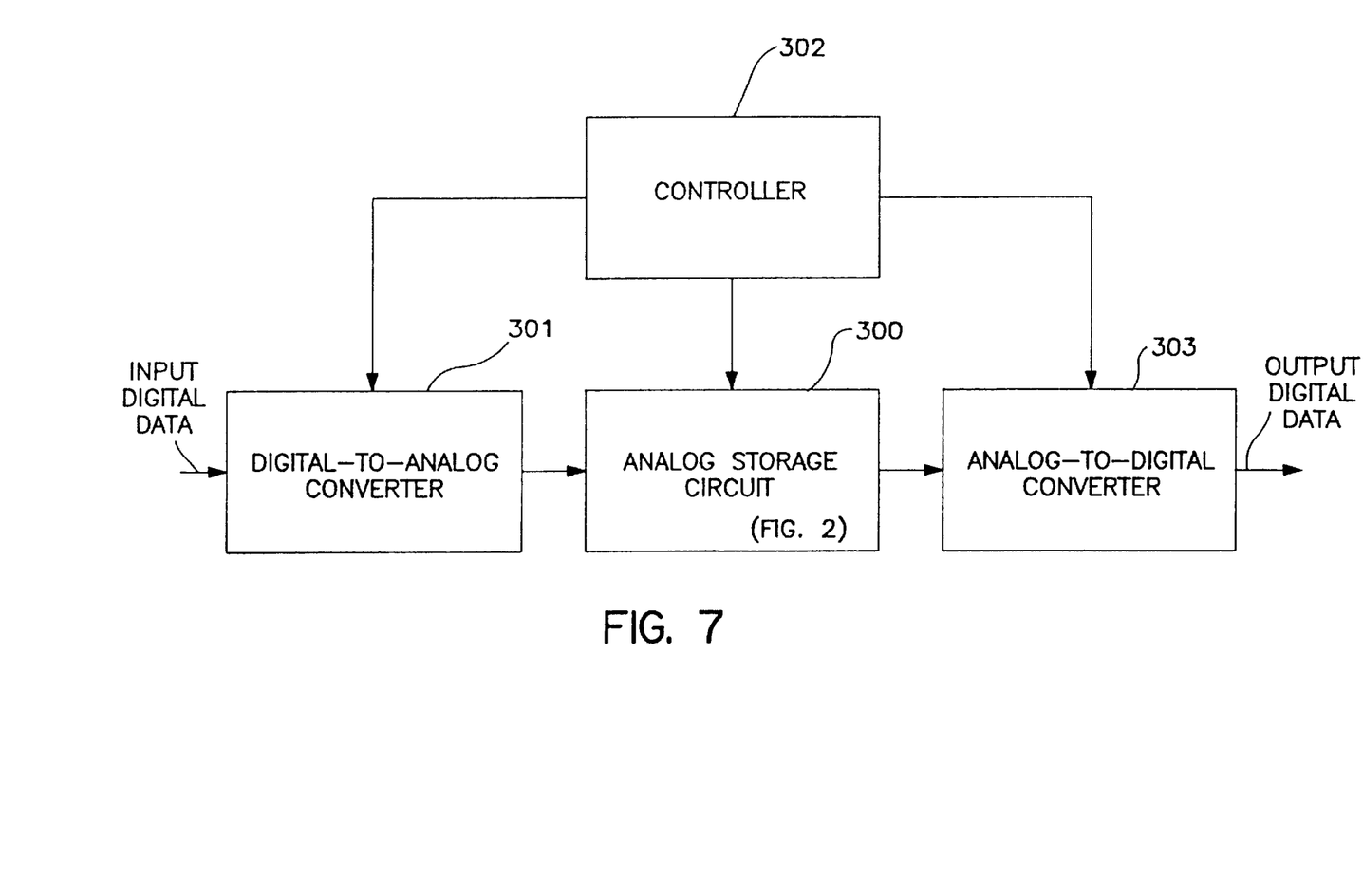
FIG. 7 is a block diagram of a digital memory system employing the analog storage system of FIG. 2 along with an analog to digital converter, a digital to analog converter and a controller.

With reference to FIG. 7, a particular application of the analog storage system will now be described. Within the system of FIG. 7, an analog storage circuit 300, configured in accordance with either of the embodiments described above, is incorporated as a component in a high density digital storage system. An input digital to analog converter 301 produces an analog voltage to represent a digital input. A controller 302 instructs analog storage circuit 300 to record the analog voltage at a known location in the memory array. When the digital data is desired, controller 302 fetches the analog output voltage from analog storage circuit 300 and instructs analog to digital converter 303 to convert the analog values and output digital data. The use of many level analog signals to represent digital data gives a large increase in storage capacity over digital systems. In the embodiment of FIG. 7, each individual analog storage cell actually stores digital data as discrete predefined voltage levels. With sixteen discrete levels per cell, each cell thus stores a four bit digital value. Six bit digital values may be stored within each cell by employing sixty-four discrete levels per cell. As can be appreciated, by achieving a high density of analog storage, numerous applications which were not heretofore feasible now become feasible.

What has been described is a method and apparatus for programming the voltage level of a storage cell, such as an EEPROM cell, within an analog storage system. The invention is advantageously employed within systems for storing a wide range of analog signal information including voice and music signals. In one embodiment, the invention is employed within a digital data storage system wherein the digital data is converted to analog form, then stored within analog storage cells having a higher storage density than conventional digital cells.

Although particular embodiments and applications of the invention are described herein, such are intended to be merely illustrative of general principles of the invention and should not be construed as limiting the scope of the invention Rather, general principles of the invention may be exploited in a wide variety of applications and in a wide range of embodiments.

What is claimed is:

1. In an analog memory device, a method for storing a voltage level within a storage element of said device, said method comprising the steps of:

a) receiving a voltage level to be stored;

b) determining a target voltage for applying to the storage element representative of a voltage level less than the received voltage level;

c) applying a voltage ramp signal to the storage element for increasing an amount of voltage held in the storage element;

d) deactivating the voltage ramp signal when the voltage level of the storage element matches the target voltage;

e) reading a resulting stored voltage of the storage element;

f) increasing the target voltage by an amount proportional to a difference between the resulting stored voltage and the received voltage level; and g) repeating steps c)–f) until the difference between the storage voltage and the received voltage level is less than a predetermined value.

2. A method for storing an input voltage level within an analog memory storage element, said method comprising the steps of:

applying a voltage ramp signal directly to the analog memory storage element for increasing a voltage level stored within the storage element toward the input voltage level; and terminating application of the voltage ramp signal to the storage element before the voltage level stored therein exceeds the input voltage level.

3. The method of claim 2, wherein the analog memory storage element is an EEPROM storage element.

4. In an analog memory device, a method for storing an analog signal as a difference voltage between a pair of storage elements of said device, said method comprising the steps of:

for each of said pair of storage elements
   a) receiving a voltage level to be stored;
   b) determining a target voltage for applying to the storage element representative of a voltage level less than the received voltage level;
   c) applying a voltage ramp signal to the storage element for increasing an amount of voltage held in the storage element;
   d) deactivating the voltage ramp signal when the voltage level of the storage element matches the target voltage;
   e) reading a resulting stored voltage of the storage element;
   f) increasing the target voltage by an amount proportional to a difference between the resulting stored voltage and the received voltage level; and
   g) repeating steps c)–f) a predetermined number of times; then
   h) comparing a resulting voltage difference between the pair of storage elements with the received voltage level to determine any difference therebetween; and
   i) adjusting the voltage level stored within one of the two storage elements by an amount sufficient to decrease any difference between the received voltage level and the difference voltage between the two storage cells.

5. The method of claim 4, wherein step i) is performed by j) selecting one of the two storage elements for receiving an increased voltage;
k) determining a new voltage level for applying to the selected storage element;
l) determining a target voltage for applying to the selected storage element representative of a voltage level less than the new voltage level;
m) applying a voltage ramp signal to the selected storage element for increasing an amount of voltage held in the selected storage element;
n) deactivating the voltage ramp signal when the voltage of the selected storage element exceeds the target voltage;
o) reading a resulting stored voltage of the selected storage element;
p) increasing the target voltage by an amount proportional to a difference between the resulting stored voltage on the selected storage element and the new voltage level; and
q) repeating steps m)–p) a predetermined number of times.

6. In an analog memory device, a method for storing a voltage level within a storage element of said device, said method comprising the steps of:

(a) receiving a voltage level to be stored;
(b) determining a target voltage for applying to the storage element representative of a voltage level less than the received voltage level;
(c) applying a voltage ramp signal to the storage element for increasing an amount of voltage held in the storage element;
(d) deactivating the voltage ramp signal when the voltage level of the storage element matches the target voltage;
(e) reading a resulting stored voltage of the stored element;
(f) increasing the target voltage by an amount proportional to a difference between the resulting stored voltage and the received voltage level; and
(g) repeating steps c)–f) a predetermined number of times.

7. The method of claim 6, wherein steps c)–f) are repeated four to six times.

8. The method of claim 6, further including:
an initial step of receiving a digital input signal and converting said digital input signal to a voltage level to be stored; and
including a subsequent step of reading the resulting stored voltage of the storage element and converting said storage voltage to a digital signal.

9. The method of claim 6, wherein the target voltage is initially chosen to be 90% of the received voltage level.

10. The method of claim 9, wherein, after an initial target voltage is stored within the storage element, subsequent target voltage levels are set to a previous target voltage level plus 90% of any remaining difference between the received voltage level and the resulting voltage level.

11. The method of claim 6, wherein a pair of storage elements are provided for storing the received voltage level as a difference voltage, wherein steps b)–g) are applied to both of the two elements, and wherein the method further includes the steps of:

h) comparing a resulting voltage difference between the two storage elements with the received voltage level to determine any difference there between; and
i) adjusting the voltage stored within one of the two storage elements by an amount sufficient to decrease any difference between the received voltage level and the difference voltage between the two storage cells.

12. The method of claim 11, wherein step i) is performed by:

j) selecting one of the two storage elements for receiving an increased voltage;
k) determining a new voltage level for applying to the selected storage element;
l) determining a target voltage for applying to the selected storage element representative of a voltage level less than the new voltage level;
m) applying a voltage ramp signal to the selected storage element for increasing an amount of voltage held in the selected storage element;
n) deactivating the voltage ramp signal when the voltage level of the selected storage element exceeds the target voltage;
o) reading a resulting stored voltage of the selected storage element;
p) increasing the target voltage by an amount proportional to a difference between the resulting stored voltage on the selected storage element and the new voltage level; and
q) repeating steps m)–p) a predetermined number of times.

13. The method of claim 11, wherein step i) is performed by:

j) selecting one of the two storage elements for receiving an increased voltage;

k) determining a new voltage level for applying to the selected storage element;

l) determining a target voltage for applying to the selected storage element representative of a voltage level less than the new voltage level;

m) applying a voltage ramp signal to the selected storage element for increasing an amount of voltage held in the selected storage element;

n) deactivating the voltage ramp signal when the voltage level of the selected storage element exceeds the target voltage;

o) reading a resulting stored voltage of the selected storage element;

p) increasing the target voltage by an amount proportional to a difference between the resulting stored voltage on the selected storage element and the new voltage level; and q) repeating steps m)–p) until the difference between the stored voltage and the received voltage level is less than a predetermined value.

14. An apparatus for storing a voltage level within a storage element, said apparatus comprising:

a) means for receiving a voltage level to be stored;

b) means for determining a target voltage for applying to the storage element representative of a voltage level less than the received voltage level;

c) means for applying a voltage ramp signal to the storage element for increasing an amount of voltage held in the storage element;

d) means for deactivating the voltage ramp signal when the voltage level of the storage element matches the target voltage;

e) means for reading a resulting stored voltage of the storage element;

f) means for increasing the target voltage by an amount proportional to a difference between the resulting stored voltage and the received voltage level; and g) means for controlling means c)–f) to operate a predetermined number of times.

15. The apparatus of claim 14, wherein the means for controlling controls means c)–f) to operate four to six times.

16. The apparatus of claim 14, wherein a pair of storage elements are provided for storing the input voltage level as a difference voltage, wherein means b)–g) operate on both of the two elements, and wherein the apparatus further includes:

means for comparing a resulting voltage difference between the two storage elements with the input voltage level to determine any difference there between; and means for adjusting the voltage level stored within one of the two storage elements by an amount sufficient to decrease any difference between the input voltage level and the difference voltage between the two storage cells.

17. The apparatus of claim 14, wherein said means for receiving the analog voltage signal comprises a track and hold circuit.

18. The apparatus of claim 14, wherein the target voltage is initially chosen to be 90% of the received voltage level.

19. The apparatus of claim 18, wherein, after an initial target voltage is stored within the storage element, subsequent target voltage levels are set to a previous target voltage level plus 90% of any remaining difference between the input voltage level and the resulting voltage level.

20. The apparatus of claim 19, wherein the sample and hold circuit samples the input analog signal voltage with an offset canceled switched capacitor and an operational amplifier circuit.

21. The apparatus of claim 14, wherein said means for determining a target voltage for applying to the storage element comprises an integrator.

22. The apparatus of claim 21, wherein the integrator includes a switched capacitor and an operational amplifier integrator.

23. The apparatus of claim 21, wherein said integrator sums an initial target voltage and any subsequently generated difference voltages.

24. The apparatus of claim 14, wherein the means for applying the voltage ramp to the storage element and for increasing the amount of voltage held in the storage element comprises:

a comparator receiving the target voltage and for continuously comparing said target voltage with the voltage level of the storage element;

a latch receiving a signal from the comparator; and a high voltage ramp circuit connected to the latch for applying a continuously increasing voltage signal to said storage element until deactivated by said latch.

25. The apparatus of claim 24, wherein the comparator includes a switched capacitor circuit.

26. The apparatus of claim 24, further including:

a digital to analog converter for converting an input digital signal to an analog signal to be stored; and an analog to digital converter for receiving a stored voltage signal from said storage element and for converting said analog signal to a digital signal.

27. The apparatus of claim 24, wherein said storage element is an EEPROM cell.

28. The apparatus of claim 27, wherein said EEPROM cell includes:

a first transistor device having a drain connected to said high voltage ramp circuit, a gate connected to a select input line, and a source; and a second transistor device having a drain connected to the source of said first transistor, a gate connected to a clear input line and a source connected to an output line, wherein said source of said second transistor is also connected through a current source to a ground.

* * * * *